United States Patent [19]

Steinbrecher

[11] 4,381,485

[45] Apr. 26, 1983

[54] MICROWAVE TEST APPARATUS AND METHOD

[75] Inventor: Donald H. Steinbrecher, Carlisle, Mass.

[73] Assignee: Steinbrecher Corporation, Woburn, Mass.

[21] Appl. No.: 237,575

[22] Filed: Feb. 23, 1981

[51] Int. Cl.³ .............................................. G01R 27/04
[52] U.S. Cl. ................................ 324/58 C; 324/58 R; 324/58 A; 324/58.5 R
[58] Field of Search ................ 324/58 R, 58 A, 58 C, 324/58.5 R, 58.5 A, 58.5 C

[56] References Cited

U.S. PATENT DOCUMENTS

| | | | |
|---|---|---|---|
| 4,050,015 | 9/1977 | Zollner | 324/58.5 C |
| 4,206,399 | 6/1980 | Fitzky et al. | 324/58.5 C |
| 4,277,741 | 7/1981 | Faxvog et al. | 324/58.5 C |

Primary Examiner—Stanley T. Krawczewicz
Attorney, Agent, or Firm—Irving M. Kriegsman

[57] ABSTRACT

A method and apparatus for monitoring the resonant frequency and absorption level at resonance of an absorption type resonant cavity which involves providing a voltage controlled oscillator, applying to the control input of the voltage controlled oscillator a control signal having a main component $V_m$ and a dither component $V_d$, splitting the output signal from the voltage controlled oscillator into a portion directed along a test path and a portion directed along a reference path, the reference path including an attenuator controlled by a voltage signal $V_k$, directing the signal in the test path through the resonant cavity, splitting the signal emerging from the resonant cavity into a portion directed along a frequency detection path and a portion directed along a level detecting path, using the signal directed along the frequency detection path for generating a signal for changing the amplitude of $V_m$ until the center frequency of the output signal of the voltage controlled oscillator is at the resonant frequency $f_r$ of the cavity, and using the signal directed along the level detection path for changing $V_k$ until the level of the signal in the reference path is equal to the depth of the null of the signal in the level detection path.

8 Claims, 4 Drawing Figures

MICROWAVE TEST APPARATUS AND METHOD

BACKGROUND OF THE INVENTION

The present invention relates generally to a method and apparatus for monitoring the electrical characteristics of a resonant cavity and, more particularly, to a method and apparatus for automatically tracking and monitoring the resonant frequency and absorbtion level of a high frequency resonant cavity that is perturbed by a material introduced into the resonant cavity.

It is well known that when a beam of high frequency energy is passed through a dielectric material, a portion of the energy will be absorbed, causing a reduction in level of the energy emerging from the material. The amount of attenuation is dependent, at least in part, on the real and imaginary parts of the dielectric constant of the dielectric material. Any changes in the dielectric constant will produce changes in the attenuation. It is also known that when a beam of high frequency energy is directed against a magnetic material, a portion of the energy will be absorbed causing a reduction in the energy emerging from the material, the reduction in energy depending, at least in part, on the real and imaginary parts of the magnetic permeativity of the material. Any changes in the magnetic permeativity of the material will produce changes in amount of energy absorbed. In addition, it is known that when a beam of high frequency energy is directed into a high frequency resonant cavity that is perturbed by either a dielectric material or a magnetic material, the material will produce a change in the resonant frequency of the resonant cavity and a reduction in the level of the outgoing beam, both of these parameters being dependent on the electrical characteristics of the perturbing material.

In recent years, a number of different systems making use of these principles have either been proposed or actually put into use for the purpose of monitoring the characteristics or changes in the characteristics of a sample material. One particular application for these systems have been in measuring the moisture content of tobacco or other water containing materials such as fuel oil.

Although the prior art systems have proven to be more or less adequate for the particular purposes for which they have been designed, these systems have not proven to be entirely satisfactory for all applications. One of the fundamental limitations of some of the prior art systems is that the measurements are made in a relatively slow manner. Another fundamental shortcoming of some of the prior art systems has been that they have generally involved some form of manual adjustment, either in connection with maintaining the resonant cavity at resonance or in adjusting some component that is used to measure the attenuation losses produced by the perturbing material. Another limitation of some prior art systems has been that they are not applicable for use with continuously moving test pieces. Other prior art systems monitor either the resonant frequency or the null depth at resonance but not both properties.

In many industrial process control systems it would be very helpful if one could accurately, quickly and automatically monitor changes in the electrical characteristics of a material. For example in the production of certain semiconductor materials it would be desirable to be able to quickly and automatically penetrate electrical signals corresponding to changes in the dielectric constant of a constituent present in a material as it is moving from one station to another. Such signals could then be used in either a feed forward or a feedback arrangement to make appropriate changes in the amount of the constituent that is present in the material.

It is the general purpose of this invention to provide a system which overcomes the aforementioned limitations by accurately, quickly and automatically generating signals representative of changes in the resonant frequency and absorbtion at resonance of a resonant cavity as it is perturbed by a material.

U.S. Pat. No. 2,798,197 discloses a microwave bridge circuit in which a sample is situated in one bridge arm and the other bridge arm is provided with a calibrated attenuator and phase shifter which are varied to obtain a balanced condition. The attenuator and phase shifter values are then used to determine the dielectric constant of the sample.

In U.S. Pat. No. 3,360,721 there is disclosed a microwave measurement system designed to detect the moisture content of tobacco. Frequency modulated microwave energy from an oscillator at a level set by a manually adjustable variable attenuator is coupled to a microwave transmitter or horn. The transmitted energy passes through a tobacco sample holder to a microwave receiver also in the form of a horn. A manually adjustable precision variable attenuator follows the receiver and couples the received energy to a detector. The precision variable attenuator is set to provide a maximum detected signal in the absence of a tobacco sample in the holder. Subsequent introduction of a sample causes a reduction in detected signal which is then compensated for by a change in the setting of the precision variable attenuator. This change in setting equals the attenuation added to the system by absorbtion of the microwave energy by the tobacco sample and corresponds to the moisture content of the tobacco.

In U.S. Pat. No. 3,460,031 there is disclosed a split waveguide moisture probe wherein the moisture content of a paper web is determined by passing the web through the gap between the probe sections. A variable attenuator at the waveguide output is used to determine the increased waveguide attenuation resulting from the passing paper web. This increased attenuation provides a measure of the web moisture content. Also disclosed in an alternate system for detecting web moisture using a split waveguide resonator probe, wherein, insertion of the web into the resonator gap changes the resonant frequency and Q of the resonator. These changes in these quantities are measured and utilized to determine web moisture content directly or as a crosscheck against an attenuation measurement.

In U.S. Pat. No. 3,498,112 there is disclosed a system for determining the moisture content of fuel oil in which energy from a microwave power source is split, with one portion of the energy being coupled through an attenuator circuit and the other portion through a sample holder containing no sample. The attenuator circuit is set so that its output when compared in a ratio meter with the output energy from the empty sample holder gives a value of 1. Subsequently placement of an oil sample in the holder, provides a ratio reduction which can then be related to the oil moisture content.

In U.S. Pat. No. 3,766,471 there is disclosed a method and apparatus for determining the moisture content of freshly prized remoistened tobacco compressed into hogs-heads. An alternating voltage is applied to a pair of electrodes connected in a circuit and thrust into the hogs-head. A phase sensitive voltmeter connected to the electrode circuit measures the component of the current in that circuit which is in phase with the alternating voltage, and hence the resistive component of the impedance between the electrodes. A logarithmic converter transforms this resistive component of the impedance between the electrodes into a signal varying linearly with moisture content.

In U.S. Pat. No. 3,77,258 there is disclosed a moisture measuring system wherein tobacco moving along a conveyor belt is compressed with a force several times the force of the dead weight of the tobacco. The compressed tobacco has an electric field applied through a first and second electrode positioned on the same side thereof. The electrodes constitute a capacitor which is part of a tuned circuit and under resonance conditions the signal derived from the tuned circuit has a magnitude corresponding to the percentage of moisture in the tobacco.

In U.S. Pat. No. 3,795,984 there is disclosed a system wherein measuring capacitor has a capacitance which varies with moisture content of the material. The capacitor is part of a tuned circuit which is kept in resonance by changing the frequency applied thereto. A voltage having an amplitude corresponding to the change in frequency constitutes a measuring signal indicative of moisture content in a high moisture content in a high moisture content range. A rectified signal derived from the voltage or current in the tuned circuit constitutes a measuring signal indicative of moisture content in the low moisture content range.

Other known patents relating to moisture measurement using high frequency energy are British Pat. No. 1,124,461, British Pat. No. 1,376,747 and U.S. Pat. No. 3,913,012.

Other known patents involving the use of high frequency energy for measuring thickness of materials are U.S. Pat. No. 3,522,527, U.S. Pat. No. 4,075,555, and British Pat. No. 993,050.

SUMMARY OF THE INVENTION

It is an object of this invention to provide a new and improved method and apparatus for monitoring the characteristics of a resonant cavity.

It is a further object of this invention to provide a new and improved method and apparatus for monitoring the characteristics of a microwave frequency resonant cavity.

It is another object of this invention to provide a new and improved method and apparatus for monitoring the electrical characteristics of a microwave frequency resonant cavity arranged for operation in an absorbtion mode.

It is still another object of this invention to provide a new and improved method and apparatus for monitoring changes in the resonant frequency and null depth at resonance of microwave frequency resonant cavity operating in an absorbtion mode.

It is yet still another object of this invention to provide a new and improved method and apparatus as described above in which the resonant frequency and null depth at resonance are monitored quickly, efficiently, continuously, simultaneously and automatically.

It is another of this invention to provide a method and apparatus of the type described above which is especially useful with industrial process control systems involving continuously moving test materials.

It is still another object of this invention to provide a new and improved technique for simultaneously and automatically tracking and monitoring the resonant frequency and null depth at resonance of a microwave resonant cavity arranged for operation in an absorbtion mode.

It is yet still another object of this invention to provide a new and improved technique especially useful in monitoring changes in the amount of moisture in a material and/or changes in the real or imaginary parts of the dielectric constant of a dialectric material and/or changes in the real or imaginary parts of a magnetic permeativity of a magnetic material.

A method of monitoring the electrical characteristics of a microwave resonant cavity arranged for operation in an absorbtion mode according to the principles of the present invention comprises automatically tracking the resonant frequency of the cavity and generating in the course thereof an electrical signal proportional to the resonant frequency thereof and simultaneously therewith automatically tracking the null depth at resonance of the cavity and generating in the course thereof an electrical signal or signals related to the null depth at resonance.

The apparatus for monitoring the electrical characteristics of a microwave resonant cavity arranged for operation in an absorbtion mode according to the principles of the present invention comprises means for automatically tracking the resonant frequency of the cavity and generating in the course thereof an electrical signal proportional to the resonant frequency of the cavity and means for simultaneously tracking the null depth at resonance of the cavity and generating in the course thereof an electrical signal or signals related to the null depth at resonance.

The foregoing and other objects and advantages will appear from the description to follow. In the description, reference is made to the accompanying drawings which form a part thereof, and in which is shown, by way of illustration, a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE INVENTION

In the drawings wherein like reference numerals represent like parts:

Figure 3:
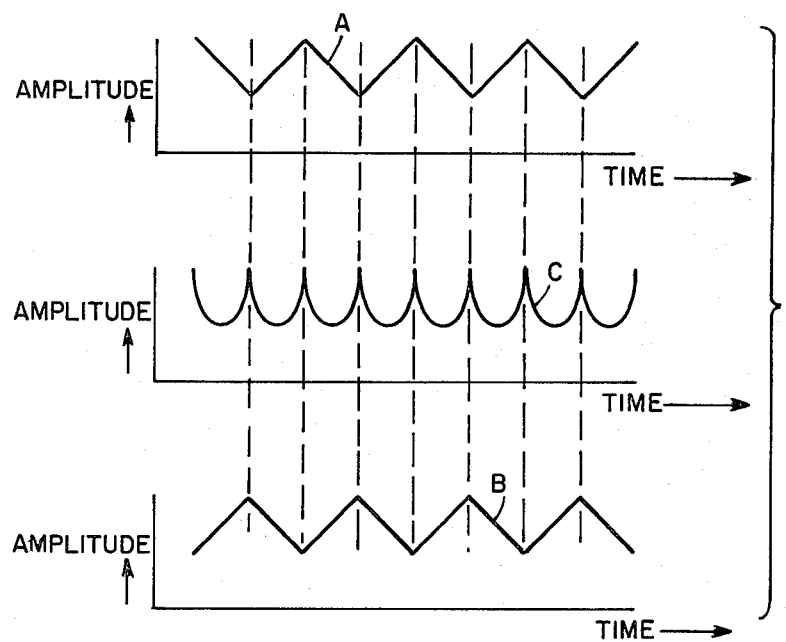
Figure 4:
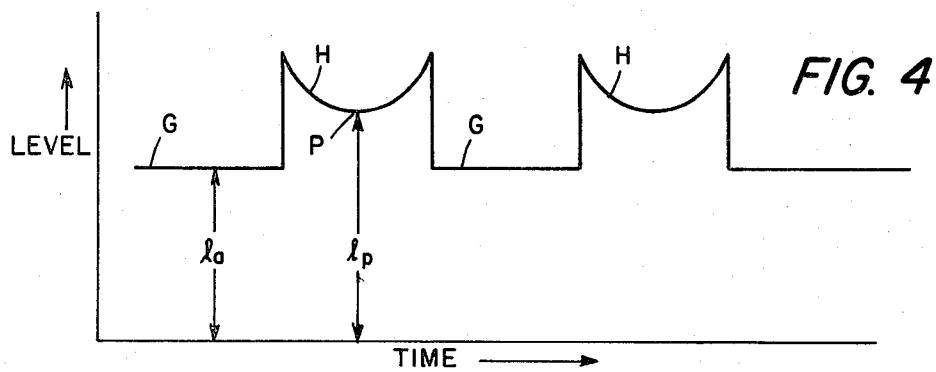

FIG. 3 is a set of three curves of amplitude vs. time of the output of the first detector shown in FIG. 2, one of the curves being at a frequency below resonance, another one of the curves being at resonance, and the third curve being at a frequency above resonance; and FIG. 4 is a curve of level vs. time for the signal traveling along the reference path in the apparatus shown in FIG. 2 before adjustment and for the signal traveling along the level equalization loop path in the apparatus shown in FIG. 2.

DETAILED DESCRIPTION OF PREFERRED EMBODIMENT

The present invention is directed to a technique for automatically and simultaneously tracking and monitoring the resonant frequency and null depth at resonance of a microwave resonant cavity arranged for operation in an absorbtion mode. It is to be understood that while the invention provides monitoring of both the resonant frequency and the null depth at resonance of the resonant cavity, in many applications monitoring of only one or the other of these characteristics is all that may be required or desired.

In carrying out the technique of the invention, a control signal to a microwave voltage controlled oscillator is amplitude modulated with a dither signal to produce an output signal from the voltage controlled oscillator that is continually swept about a center frequency. The output signal is split into a test path and a reference path. The center frequency of the signal in the test path is raised or lowered, if necessary, so as to be in the vicinity of the resonant frequency of the cavity and is then passed through the resonant cavity. The center frequency of signal emerging from the resonant cavity is changed back to its original frequency. The signal is then split into two parts.

One part of the split signal is used to monitor the resonant frequency and the other part of the split signal is used to monitor the null depth at resonance.

The part of the signal used to monitor resonant frequency is fed into a first detector where it is converted into a voltage output proportional to the RF signal level. Because of the dither component in the signal the voltage output is a variable signal whose characteristics depend on whether the center frequency is above the resonant frequency, below the resonant frequency or at the resonant frequency of the cavity. The voltage output is compared with a reference (square wave) signal to produce a first error signal which is used to adjust the amplitude of the average component of the control signal applied to the voltage controlled oscillator so that the center frequency of the output of the voltage controlled oscillator is at the resonant frequency of the cavity. Any changes in the resonant frequency, such as caused by a material perturbing cavity, cause changes in the first error signal resulting in an adjustment in the amplitude of the average component of the control signal applied to the voltage controlled oscillator.

The part of the signal from the resonant cavity that is used to monitor null depth at resonance is fed into one input terminal of a single pole double throw switch whose output is connected to a second detector. The output signal from the voltage controlled oscillator traveling along the reference path is fed into the other input terminal of the signal pole double throw switch through a variable attenuator and a step attenuator. The single pole double throw switch is switched from one input terminal to the other at exactly the same rate at which the control signal to the voltage controlled oscillator is being dithered so that in each position the second detector receives a signal corresponding to one complete sweep of the signal about its center frequency, the signal in one switch position being a signal before it is passed through the cavity and the signal in the other switch position being a signal after it is passed through the cavity. The level of the signal passed through the resonant cavity is sampled at its lowest point and compared with the level of the signal in the reference path and is used to generate a second error signal which adjusts control signals to the two attenuators until the level of the signal traveling along the reference path is equal to the level of the signal passed through the resonant cavity. Any changes in the null depth of the signal passed through the cavity, such as caused by a material perturbing the cavity result in the generation of the second error signal causing a change in the control signals to the attenuators.

The average component of the control signal applied to the voltage controlled oscillator constitutes a signal whose amplitude is proportional to the resonant frequency of the cavity and the control signal used to adjust the attenuators constitute signals related to the null depth of the cavity at resonance. As can be appreciated the technique is accurate, quick and produces signals related to the resonant frequency of a resonant cavity and the null depth at resonance of a resonant cavity at the same time.

Although the invention will hereinafter be described in detail with reference to components operable at microwave frequencies, it is to be understood that the principles are applicable to radio frequencies and other lower frequency ranges.

Figure 1:
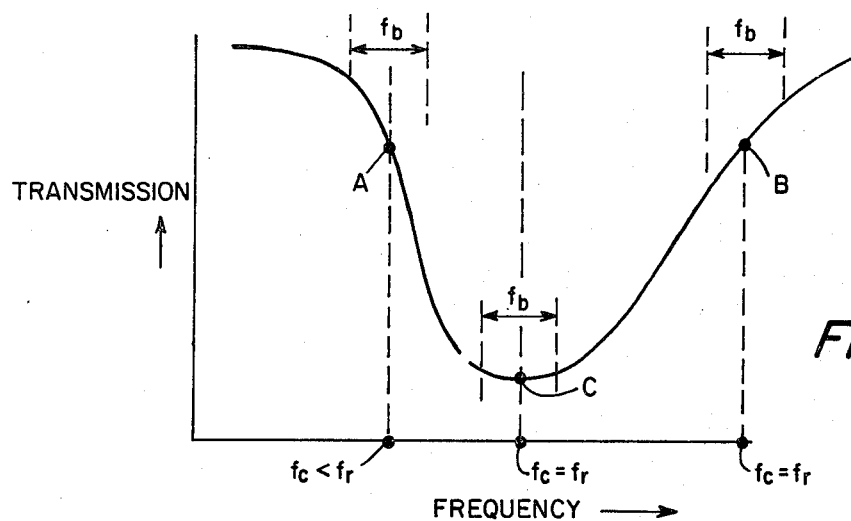
FIG. 1 is a curve of transmission vs. frequency of a microwave resonant cavity arranged for operation in an absorbtion mode.

Referring now to FIG. 1, there is shown a typical transmission curve for a microwave frequency resonant cavity arranged for operation in an absorbtion mode. As can be seen, the transmission drops down and reaches a minimum at the resonant frequency $f_r$ of the cavity.

Figure 2:
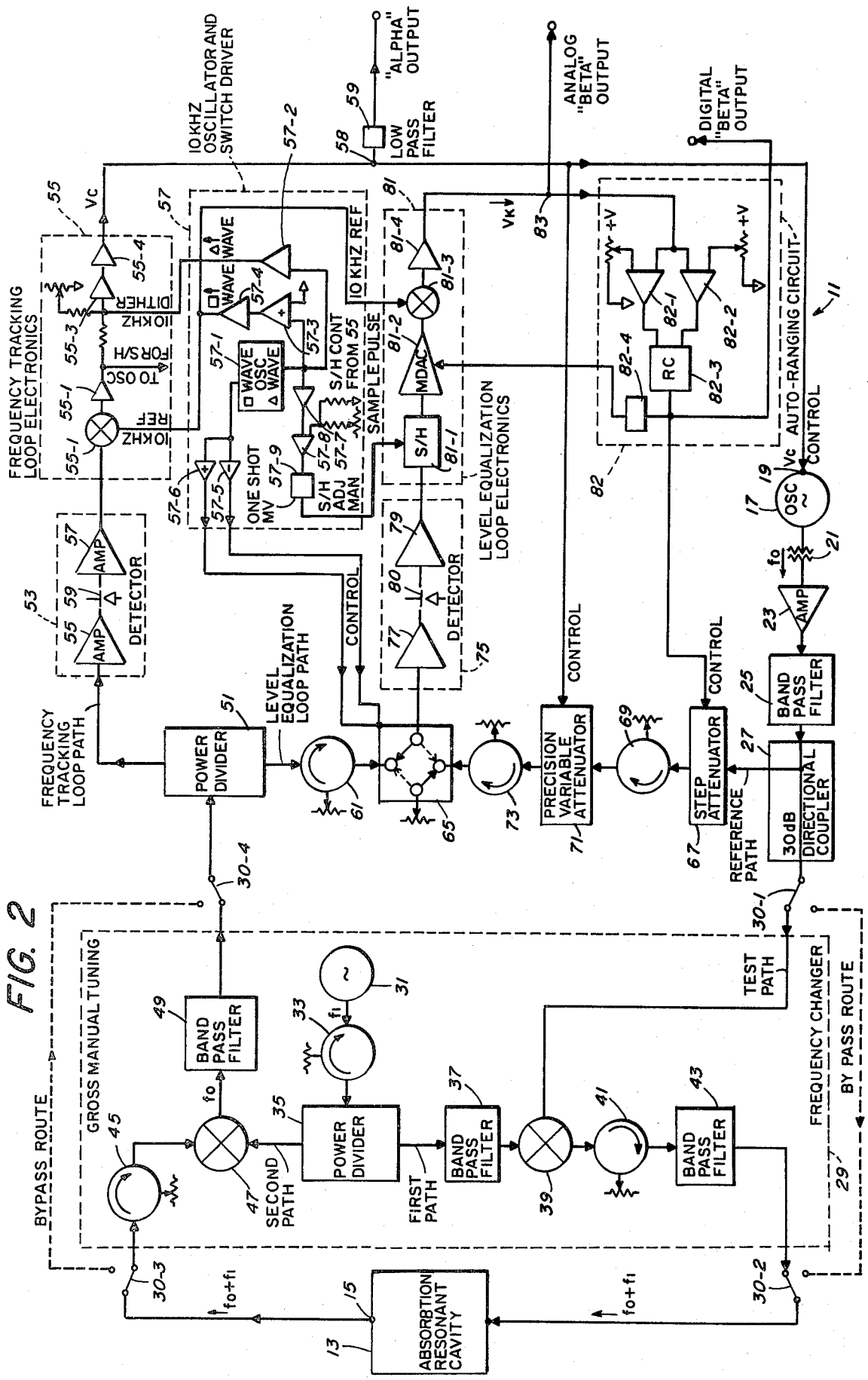
FIG. 2 is a block diagram of an apparatus constructed according to the teachings of the present invention.

Referring not to FIG. 2, there is shown an embodiment of an apparatus in block diagram form for practicing the invention, the apparatus being identified generally by reference numeral 11. For simplicity, the power supply which furnishes power to all the active components in the apparatus 11 is not shown.

Apparatus 11 includes a microwave resonant cavity 13 having an input port 14 and an output port 15. Cavity 13 is arranged for operation in an absorbtion mode. Thus, at the resonant frequency the absorbtion losses are at a maximum.

A voltage controlled oscillator 17 produces a signal in the microwave frequency region at a frequency which varies according to the amplitude of a control voltage $V_c$ applied to it through a control voltage port 19. Control voltage $V_c$ is composed of a main component $V_m$ which is changed in a manner which will hereinafter be explained and a dither component $V_d$ which amplitude modulates the main component $V_m$ at a dither rate $f_d$ of 10 KHZ. The amplitude of main component $V_m$ of control voltage signal $V_c$ sets the center frequency $f_c$ of the output signal $V_o$ from voltage controlled oscillator 17 while the amplitude and frequency of the dither component $V_d$ sets the frequency band $f_b$ and frequency, respectively of the dither. As an example, $V_m$ may be 30 volts DC and $V_d$ may be $\pm\frac{1}{2}$ volt DC, causing thereby an output signal $V_o$ from the voltage controlled oscillator 17 at a center frequency $f_c$ of 1.5 GHZ which is swept over a frequency band $f_b$ of 10 MHZ at a 10 KHZ rate $f_d$.

The output signal from voltage controlled oscillator 17 is passed through an attenuator 21 and then through a buffer amplifier 23 which collectively serve to isolate the voltage controlled oscillator 17 from any external load variations and raise the output signal to an appropriate level. The signal leaving buffer amplifier 23 is fed into a band pass filter 25 which removes any harmonics present in the signal produced by the voltage controlled oscillator 17. The signal passed by band pass filter 25 is fed into a 30 dB directional coupler 27 which splits the signal into two signal paths, namely, a test path and a reference path, the reference path being 30 DB less than the test path.

The signal directed along the test path is fed into resonant cavity 13 through a frequency changer 29 which serves to raise or lower the center frequency $f_c$ of the signal by an amount $f_l$ so that the signal passed into resonant cavity 13 is in the vicinity of the resonant frequency $f_r$ of the resonant cavity 13. The signal leaving the resonant cavity 13 is fed back into frequency changer 29 where the frequency $f_l$ previously added to or subtracted is removed.

Frequency changer 29 includes a manually controlled variable oscillator 31 whose output at a frequency $f_l$ is fed through an isolator 33 into a power divider 35 which splits the signal into first and second signal paths. The signal traveling along the first path is passed through a band pass filter 37 and then into a mixer 39 where it is mixed with the signal traveling along the test path so as to produce an output signal having a center frequency $f_c+f_l$. The signal leaving mixer 39 is then passed through an isolator 41 and a band pass filter 43 to remove any harmonics present and then fed into resonant cavity 13 through input port 14. The signal leaving resonant cavity 13, which is still at a center frequency $f_c+f_l$ is passed through an isolator 45 and fed into a mixer 47 where it is mixed with the signal traveling along the second path to produce an output signal having a center frequency $f_c$. The output signal from mixer 47 is then passed through a band pass filter 49.

As can be appreciated, frequency changer 29 is essentially a gross manual tuning circuit for changing the center frequency $f_c$ of the output signal from the voltage controlled oscillator 17 so that it is in the vicinity of the resonant frequency $f_r$ of the resonant cavity 13 (i.e. where the transmission drops), if such a change is necessary. Thus, frequency changer 29 is basically a mechanism for allowing the apparatus to be used with resonant cavities having different resonant frequencies. If it is not necessary to raise or lower center frequency $f_c$ to place it in the vicinity of $f_r$, frequency changer 29 may be by-passed by placing switches 30-1 through 30-4 in their by-pass position and coupling into and out of resonant cavity 13 directly as shown by the dotted lines labelled "by-pass route". Switches 30-1 through 30-4 may be simple, manually operated switches, switches 30-1 and 30-3 having one input terminal and two output terminals and switches 30-2 and 30-4 having two input terminals and one output terminals.

The signal from band pass filter 49 (or the by-pass signal if frequency charger 29 is by-passed) is fed into a power divider 51 which splits the signal into two paths, one of the paths being a frequency tracking loop path FTLP and the other path being a level equalization loop path LELP.

The signal traveling along the frequency tracking loop path is fed into a first detector 53 which changes the RF signal into a voltage output proportional to the RF signal level. Frequency detector 53 may comprise an RF amplifier, a low frequency AC amplifier 57 and a diode 59. Because the input signal to first detector 53 is a dithered signal, the level of the output signal from first detector 53 will continually change in time and the characteristic slope of the signal will depend on the particular location of the center frequency $f_c$ on the absorbtion curve of the resonant cavity. Thus, for example, if the center frequency $f_c$ is below resonance, such as a point A on the curve shown in FIG. 1, the output curve will appear as shown on curve A in FIG. 3. On the other hand, if the center frequency $f_c$ is above resonance, such as at point B on the curve shown in FIG. 1, the output curve will be exactly 180° out of phase with curve A in FIG. 3 as shown in curve B of FIG. 3. Finally, when the center frequency $f_c$ is exactly at the resonant frequency $f_r$ of the cavity 13, the output curve will appear as shown in curve C in FIG. 3.

The output signal from first detector 53 is fed into a frequency tracking loop electronics circuit 55 where it is processed with a 10 KHZ reference signal from a 10 KHZ oscillator and switch driver 57, to produce an error signal indicating whether the center frequency $f_c$ is on the low side of the resonant frequency $f_r$, on the high side of the resonant frequency $f_r$ or at the resonant frequency $f_r$. The error signal is then used to adjust the value of the main component $V_m$ of the control signal $V_c$ emitted from frequency tracking loop electronics circuit 55 until the center frequency $f_c$ of the output of voltage $V_o$ from voltage controlled oscillator 17 is at the cavity resonant frequency $f_r$. The main component $V_m$ of the output signal $V_c$ is summed in the frequency tracking loop electronics circuit 55 with a 10 KHZ dither signal from the 10 KHZ oscillator and driver circuit 57 so that the output signal $V_c$ also includes the dither component $V_d$.

Frequency tracking loop electronics circuit 55 includes a synchronous detector 55-1, a first amplifier 55-2, a summing amplifier 55-3 and a buffer amplifier 55-4. The 10 KHZ oscillator and switch driven 57 includes an oscillator 57-1 that produces a square wave output at one terminal and a triangular wave output at another terminal, a buffer amplifier 57-2, a comparator 57-3, a buffer amplifier 57-4, a pair of buffer amplifiers 57-5 and 57-6, a buffer amplifier 57-7, a comparator 57-8 and a one shot multivibrator 57-9.

A portion of the output signal $V_c$ from the frequency tracking loop electronics circuit 55 is tapped off at point 58, passed through a low pass filter 59 to remove the dither component and used as an "alpha" (analog) output signal which is proportional to the resonant frequency $f_r$ of the resonant cavity 13.

The signal passed through power divider 51 and transmitted along the level equalization loop path LELP is passed through an isolator 61 and then fed into one of the input ports 63 of single pole double throw switch 65 which is switched from input port 63 to the other input port 65 at the same 10 KHZ rate at which the dither control signal $V_d$ is being dithered, through a control signal from the 10 KHZ oscillator and switch driver 57.

Isolator 61 serves to isolate first detector 53 from the control signal applied to switch 65.

The signal passed by the 30 dB directional coupler 27 and traveling along the reference path is fed into a precision step attenuator 67 which makes "course" adjustments in the regional level of the transmitted signal. The output of the precision step attenuator 67 is passed through an isolator 69 into a precision variable attenuator 71 which makes "fine" adjustments in the signal level. The output signal from precision variable attenuator 71 is passed through an isolator 73 into the single pole double throw switch 65 through input port 63. Thus, the single pole double throw switch 65 receives two inputs, one containing (a portion of) the signal produced by voltage controlled oscillator 17 before it is passed through the resonant cavity 13 and the other containing (a portion of) the signal after it is passed through the resonant cavity 13, switch 65 being switched from one input position to the other at a 10 KHZ rate.

Isolators 69 and 71 may be integrally formed with attenuator 71 and serve to maintain matched conditions on the input and output of attenuator 71.

The output signal from the signal pole double throw switch 65 is fed into a second detector 75 which converts the RF signal received into a voltage output proportional to its RF signal level. Second detector 75 comprises an RF amplifier 77, a low frequency AC amplifier 79 and a diode 80. Since the single pole double throw switch 65 is switching between its two positions at the same rate (i.e. 10 KHZ) as the output signal from the voltage controlled oscillator 17 is being dithered, during one half of the 10 KHZ cycle the input to second detector 75 will be the signal traveling along the reference path through attenuators 67 and 71 producing an output that is constant in level as shown by the flat curve G in FIG. 4, while during the other half of the cycle the input to second detector 75 will be the same as the signal traveling along the level equalization loop path from power divider 51, having a level that changes as shown by curve H in FIG. 4, the level at the lowest point P being the level at the null, or at resonance. The output signal from second detector 75 is fed into a level equalization loop electronics circuit 81 which also receives a 10 KHZ reference signal and a sample pulse signal from the 10 KHZ oscillator and switch driver 57. The purpose of the sample pulse is to time the sample and hold circuit to take a reading exactly at the lowest point P on curve H in FIG. 4. In order to insure that the sample pulse sent to the level equalization loop electronics circuit 81 from oscillator and driver circuit 57 is timed exactly when input signal from cavity 13 is at the lowest point, the error signal from frequency tracking electronics loop circuit 55 is also sent to oscillator and circuit driver 57 to adjust the timing of the sample pulse. Thus, the sample pulse will always be sent at the lowest point on the curve and not merely the center position of the sweep. The level equalization loop electronics circuit 81 produces an output signal $V_k$ which is directly connected as a control signal to attenuator 67. A portion of the signal $V_k$ is tapped off at point 83 to provide an analog "beta" output signal proportional to the signal applied to attenuator 67. Control signal $V_k$ is also connected to an autoranging circuit 82 which processed the signal and produces a digital output signal $V_y$ which is used as a control signal to control the setting on attenuator 71.

In the level equalization loop electronics circuit 81, the level $l_a$ (FIG. 4) of the signal derived from the reference path is compared with the level of the signal from the level equalization loop path $l_p$ (FIG. 4) at its lowest point P and an error signal is generated whose amplitude is proportional to the difference in the two signals and whose polarity depends on whether the difference is an increase or a decrease. This error signal is then used to adjust the amplitude of the control signal $V_k$ so that the resulting settings on the two attenuators 67 and 71 are such that the level of the signal traveling in the reference path is equal to the level of the signal in the level equalization loop path.

Level equalization loop electronics circuit 81 includes a sample and hold circuit 81, a multiplying digital to analog converter 81-2, a synchronous detector 81-3 and a buffer amplifier 81-4. Autoranging circuit 82 includes a pair or comparators 82, and 82-2 a range computing element 82-3 and an AGC computing element 82-4. In addition to controlling attenuator 71, the output of autoranging circuit 82 is tapped off at point 85 to provide a digital "beta" output signal and fed back into the level equalization loop electronics circuit 81 through the AGC computing element to control the loop gain in the level equalization loop electronics circuit 81.

Thus, the level equalization loop circuit is basically a mechanism for monitoring changes in the null depth of the resonant cavity by monitoring changes that have to be made in the level of a signal passed through the reference path so as to be equal to the level at null of a signal passed through the resonant cavity.

As can be appreciated, the system provides three signals, an "alpha" signal proportional to the resonant frequency $f_r$ of the resonant cavity and two "beta" signals related to the null depth at resonance of the resonant cavity, one of the "beta" signals being an analog signal corresponding to the setting of various attenuator 67 and the other "beta" signal being a digital signal corresponding to the setting of step attenuator 71.

The parts that may be used for the major components are as follows:

| Part | Part No. | Manufacturer |
| --- | --- | --- |
| Synchronous Detector 55-1 | AD 532 | Analog Devices |
| Amplifier 55-2,55-3,55-4 | TL 083 | Texas Instrument |
| Oscillator 57-1 | LM 566 | National Semi. |
| Amplifiers 57-2,57-3,57-4 57-5,57-6,57-7 | TL 083 | Texas Instrument |
| Comparator 57-8 | LM 311 | National Semi |
| One Shot MV 57-9 | CA 4098 | RCA |
| Sample/Hold Circuit 81-1 | SHM-1C-1 | Datel |
| MDAC 81-2 | AD 7520 | Analog Devices |
| Synchronous Det 81-3 | AD 532 | Analog Devices |
| Amp. 81-4 | TL 083 | Texas Instrument |
| AGC comp. and R company | Standard CMOS SS1 and MS1 | Integrated Circuits |

Although a particular embodiment of the invention has been described and illustrated herein, it is recognized that modifications and variations may readily occur to those skilled in the art and consequently, it is intended that the claims be interpreted to cover such modifications and equivalents.

What is claimed is:

1. A method of monitoring the characteristics of an absorbtion type resonant cavity comprising:
   a. electronically tracking the resonant frequency of the cavity and obtaining in the course thereof an electrical signal related to resonant frequency, and
   b. concurrently therewith, electronically tracking the absorbtion level of the cavity at resonance and obtaining in the course thereof an electrical signal related to the absorbtion level.

2. The method of claim 1 and wherein electronically tracking the resonant frequency of the resonant cavity comprises:
   a. providing a voltage controlled oscillator,
   b. applying a dithered control signal to the voltage controlled oscillator so as to produce an output signal from the voltage controlled oscillator that is dithered about a center frequency $f_c$,
   c. passing at least a portion of the output signal from the voltage controlled oscillator through the resonant cavity, d. generating from the signal emerging from the resonant cavity a first error signal related to the deviation in the center frequency $f_c$ of the signal passed through the cavity and the resonant frequency $f_r$ of the cavity, and e. using the first error to adjust the control signal applied to the voltage controlled oscillator so that the center frequency $f_c$ of the output signal of the voltage controlled oscillator is equal to the resonant frequency $f_r$ of the cavity, the control signal to the voltage controlled oscillator constituting a signal proportional to the resonant frequency $f_r$ of the cavity.

3. The method of claim 2 and wherein generating a first error signal comprises comparing the slope of the signal passed through the resonant cavity with the slope of a reference signal and obtaining there from a signal related to the difference in slope of the two signals.

4. The method of claim 2 and wherein electronically tracking the absorbtion level of the cavity at resonance comprises:

a. directing at least a portion of the output signal from the voltage controlled oscillator along a reference path, the reference path including an attenuator, b. generating a second error signal corresponding to the difference in level of the signal traveling along the reference path and the signal passed through the resonant cavity at resonace, and c. using the second error signal to adjust the amplitude of a control signal applied to the attenuator until the level of the signals are equal, the control signal applied to the attenuator constituting a signal proportional to the null depth of the resonant cavity at resonance.

5. A method of monitoring the resonant frequency and absorbtion level at resonance of an absorbtion type resonant cavity comprising:

a. providing a voltage controlled oscillator, b. directing at least a portion of the output signal from the voltage controlled oscillator into the resonant cavity, c. using the signal emerging from the resonant cavity to adjust a control signal applied to the voltage controlled oscillator so that the output signal of the voltage controlled oscillator is at resonance, the amplitude of the control signal being related to the resonant frequency, and d. using the signal emerging from the resonant cavity to generate a signal related to the absorbtion level at resonance.

6. A method of monitoring the resonant frequency and absorbtion level at resonance of an absorbtion type resonant cavity comprising:

a. providing a voltage controlled oscillator, b. applying to the control input of the voltage controlled oscillator a control signal having a main component $V_m$ and a dither component $V_d$, c. splitting the output signal from the voltage controlled oscillator into a portion directed along a test path and a portion directed along a reference path, the reference path including an attenuator controlled by a voltage signal $V_k$, d. directing the signal in the test path through the resonant cavity, e. splitting the signal emerging from the resonant cavity into a portion directed along a frequency detection path and a portion directed along a level detection path, f. using the signal directed along the frequency detection path for generating a signal for changing the amplitude of $V_m$ until the center frequency of the output signal of the voltage controlled oscillator is at the resonant frequency $f_r$ of the cavity, and g. using the signal directed along the level detection path for changing $V_k$ until the level of the signal in the reference path is equal to the depth of the null of the signal in the level detection path.

7. Apparatus for use in monitoring the resonant frequency and absorbtion level at resonance of an absorbtion type resonant cavity comprising:

a. voltage controlled oscillator means for generating energy, b. means for directing at least a portion of said energy into said resonant cavity and another portion of said energy along a reference path including attenuator means, c. means for automatically adjusting the amplitude of a control signal applied to the voltage controlled oscillator so that the output signal from the voltage controlled oscillator is at resonance, and d. means for automatically adjusting the amplitude of a control signal applied to the attenuator means so that the level of the signal directed along the reference path is equal to the null depth level of the output signal from the resonant cavity using said error signal to adjust the amplitude of $V_m$ until $f_c$ is equal to $f_r$.

8. Apparatus for use in monitoring the resonant frequency and null depth at resonance of an absorption type resonant cavity comprising:

a. voltage control oscillator means responsive to a control signal having a main component $V_m$ and a dither component $V_d$ for producing a high frequency output signal having a center frequency $f_c$ set by the main component $V_m$ that is swept over a frequency band $f_b$ set by dither component $V_c$ at a dither rate $f_d$, b. means for splitting the output signal from the voltage controlled oscillator into two parts, one part which is directed along a test path through the resonant cavity and the other part which is directed along a reference path having attenuator means whose setting is controlled by a control signal $V_k$, c. means for splitting the signal passed through the resonant cavity into a frequency detecting path and a level detecting path, d. frequency detector means for converting the signal traveling along the frequency detecting path into a voltage output proportional to its level, e. means responsive to the output signal from the frequency detector means for generating an error signal indicating deviations in the frequency of the output signal $f_c$ and the resonant frequency $f_r$ of the cavity and using said error signal to adjust the amplitude of $V_m$ until $f_e$ is equal to $f_r$, f. level detector means for converting the signal traveling along the reference path and the signal traveling along the level detecting path into first and second voltage outputs corresponding to their level, g. switch means for coupling in one position the signal traveling along the reference path and in another position the signal traveling along the level detecting path into the level detector means, said switch means being switched from one path to another at the dither frequency rate $f_d$ at which $V_m$ is being modulated by $V_d$, and h. means for adjusting the level of $V_k$ until the amplitudes of the first and second voltage outputs are equal, i. the amplitude of $V_d$ being proportional to the resonant frequency of the resonant cavity and the amplitude of $V_k$ being proportional to the null depth at resonance.

* * * * *